US010770531B2

(12) United States Patent
Liu (10) Patent No.: US 10,770,531 B2
(45) Date of Patent: Sep. 8, 2020

(54) ORGANIC LIGHT EMITTING UNIT, METHOD FOR MANUFACTURING THEREOF AND DISPLAY PANEL

(71) Applicant: BOE TECHNOLOGY GROUP CO., LTD., Beijing (CN)

(72) Inventor: Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/974,913

(22) Filed: May 9, 2018

(65) Prior Publication Data

US 2019/0067398 A1 Feb. 28, 2019

(30) Foreign Application Priority Data

Aug. 25, 2017 (CN) .......................... 2017 1 0742019

(51) Int. Cl.
| | | |
|---|---|---|
| *H01L 27/32* | (2006.01) | |
| *H01L 51/52* | (2006.01) | |
| *H01L 51/56* | (2006.01) | |
| *H01L 51/50* | (2006.01) | |

(52) U.S. Cl.
CPC ...... *H01L 27/3262* (2013.01); *H01L 27/3246* (2013.01); *H01L 27/3272* (2013.01); *H01L 51/5203* (2013.01); *H01L 51/5218* (2013.01); *H01L 51/5221* (2013.01); *H01L 51/56* (2013.01); *H01L 27/3276* (2013.01); *H01L 51/5012* (2013.01); *H01L 2227/323* (2013.01)

(58) Field of Classification Search
None
See application file for complete search history.

(56) References Cited

U.S. PATENT DOCUMENTS

| | | | | |
|---|---|---|---|---|
| 2007/0284627 | A1* | 12/2007 | Kimura | ............. G02F 1/134363 257/257 |
| 2009/0201231 | A1* | 8/2009 | Takahara | ............. G09G 3/3233 345/76 |
| 2010/0013379 | A1* | 1/2010 | Park | .................... H01L 27/3248 313/504 |
| 2013/0337596 | A1* | 12/2013 | Hung | ..................... H01L 51/56 438/34 |
| 2017/0025488 | A1 | 1/2017 | Li et al. | |
| 2017/0033171 | A1 | 2/2017 | Kim et al. | |

(Continued)

FOREIGN PATENT DOCUMENTS

| | | |
|---|---|---|
| CN | 103715205 A | 4/2014 |
| CN | 105140260 A | 12/2015 |

(Continued)

OTHER PUBLICATIONS

Chinese Office Action in Chinese Application No. 201710742019.7, dated Oct. 8, 2018 with English translation.

(Continued)

*Primary Examiner* — Zandra V Smith
*Assistant Examiner* — Lawrence C Tynes, Jr.
(74) *Attorney, Agent, or Firm* — Collard & Roe, P.C.

(57) ABSTRACT

An organic light emitting display unit is disclosed, which includes: a substrate; a light shielding layer and a first electrode disposed on the substrate, the light shielding layer and the first electrode are disposed on a same layer and made of a same material.

18 Claims, 4 Drawing Sheets

(56) References Cited

U.S. PATENT DOCUMENTS

| | | | |
|---|---|---|---|
| 2017/0170206 A1* | 6/2017 | Lee | H01L 51/52 |
| 2017/0186831 A1* | 6/2017 | Nam | H01L 27/3248 |
| 2018/0097047 A1* | 4/2018 | Jung | H01L 27/3258 |
| 2018/0122882 A1* | 5/2018 | Lee | H01L 27/3258 |
| 2018/0151828 A1* | 5/2018 | Im | H01L 51/5228 |
| 2018/0217458 A1* | 8/2018 | Xie | G02F 1/136209 |
| 2018/0315805 A1 | 11/2018 | Liu | |
| 2019/0355763 A1* | 11/2019 | Chen | H01L 27/1218 |

FOREIGN PATENT DOCUMENTS

| | | | |
|---|---|---|---|
| CN | 106371253 A * | 2/2017 | G02F 1/1362 |
| CN | 106371253 A | 2/2017 | |
| CN | 106409868 A | 2/2017 | |
| CN | 107068725 A | 8/2017 | |
| CN | 108336107 A | 7/2018 | |

OTHER PUBLICATIONS

Chinese Office Action in Chinese Application No. 201710742019.7, dated May 30, 2019 with English translation.

\* cited by examiner

ORGANIC LIGHT EMITTING UNIT, METHOD FOR MANUFACTURING THEREOF AND DISPLAY PANEL

CROSS-REFERENCE OF RELATED APPLICATION

The present application claims the priority of Chinese patent application No. 201710742019.7 filed on Aug. 25, 2017, the disclosure of which is hereby incorporated by reference herein in its entirety.

TECHNICAL FIELD

Embodiments of the present disclosure relate to an organic light emitting unit, a method for manufacturing the same and a display panel.

BACKGROUND

Since a conventional top-gate oxide TFT has lower parasitic capacitance and better electrical characteristics, it is regarded as the preferred backplate for organic light emitting display panel with large size and high resolution.

The TFT manufactured by top-gate self-alignment technology is commonly a coplanar structure, that is, the oxide active layer is disposed under all the metal layers (including the gate, the source and drain). However, the processes of manufacturing the same are more, the process time is long, and the cost is high.

SUMMARY

Embodiments of the present disclosure provide an organic light emitting unit, a method for manufacturing the same and a display panel. One of the purposes of the present disclosure is to save process time, lower costs, and improve the yield; and another purpose of the present disclosure is to reduce the thickness of the display panel, which is advantageous for thinning the display substrate.

According to a first respect of the present disclosure, there is provided an organic light emitting unit, which comprises: a substrate; a light shielding layer and a first electrode disposed on the substrate, the light shielding layer and the first electrode are disposed in a same layer, and are made of a same material.

According to a second respect of the present disclosure, there is provided an organic light emitting display panel, which comprises the above organic light emitting unit.

According to a third respect of the present disclosure, there is provided a method for manufacturing an organic light emitting unit, which comprises: providing a substrate; forming a light shielding layer and a first electrode on the substrate, the light shielding layer and the first electrode are disposed on a same layer, and are made of a same material.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
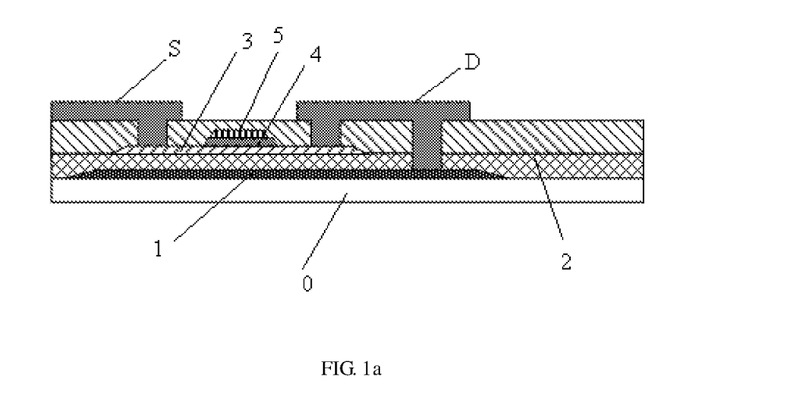
FIGS. 1a to 1f schematically illustrate steps of manufacturing an organic light emitting unit according to an embodiment of the present disclosure.
Figure 1B:
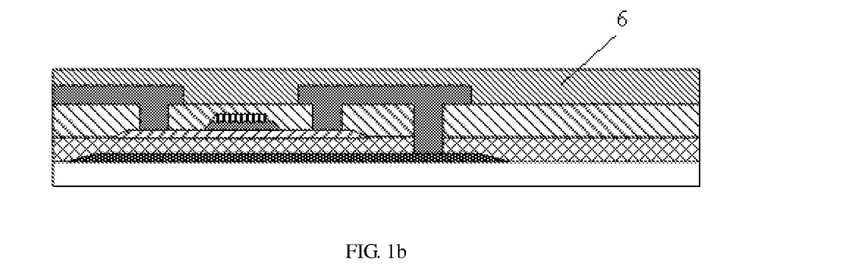
Figure 1C:
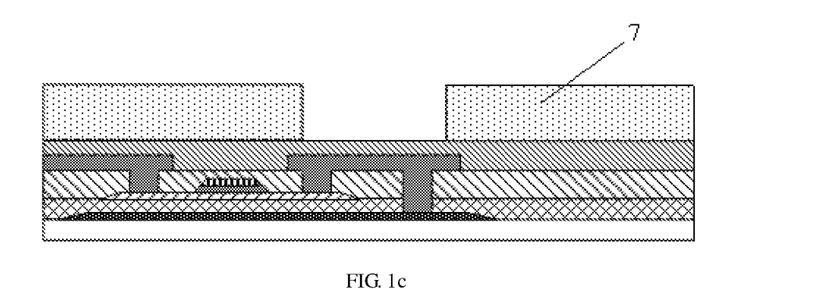
Figure 1D:
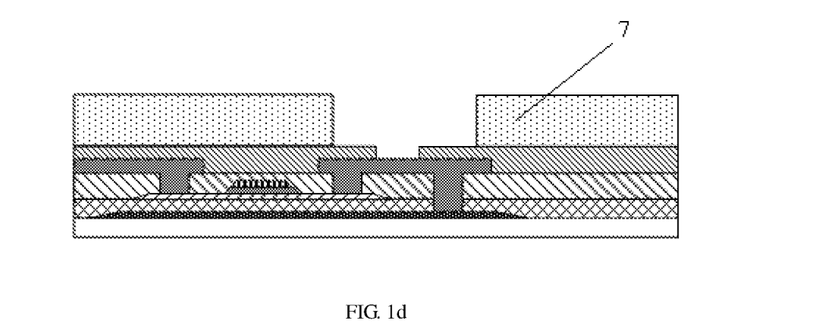
Figure 1E:
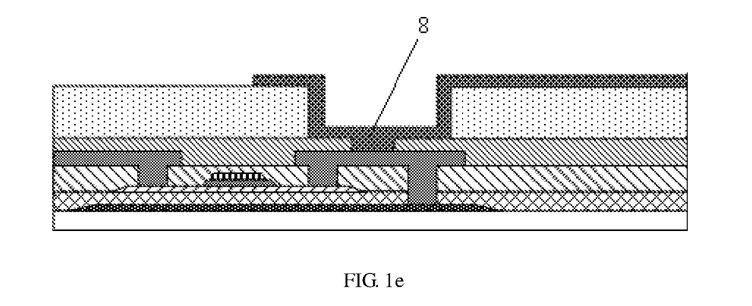
Figure 1F:
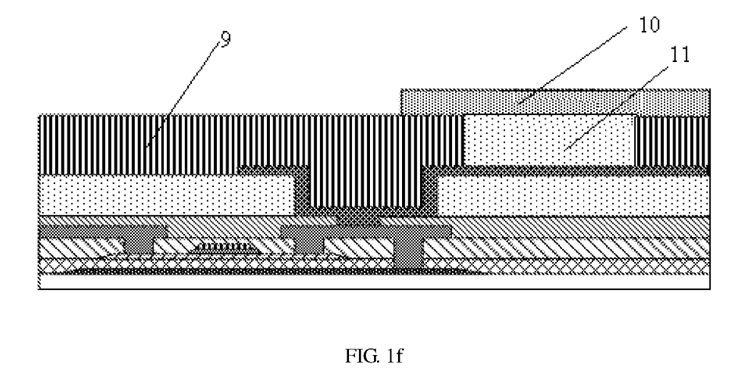

FIGS. 1a to 1f schematically illustrate steps of manufacturing an organic light emitting unit according to an embodiment of the present disclosure, which comprises: S1, forming a light shielding metal layer 1, an insulation layer 2, an active layer 3, a gate insulation layer 4, a gate 5, a source S and a drain D on a glass substrate 0, the drain D is connected with the light shielding metal layer 1, thus channels are formed above and below the active layer, and the electrical stability of the oxide TFT is improved, as illustrated in FIG. 1a; S2, forming a passivation layer 6 on a structure illustrated in FIG. 1a, as illustrated in FIG. 1b; S3, forming an organic film 7 on a structure illustrated in FIG. 1b, which is configured to achieve planarization of an entire screen, and be patterned at a position where a contact hole is to be formed later, as illustrated in FIG. 1c; S4, performing a patterning process, so as to etch a contact hole on the exposed passivation layer 6, as illustrated in FIG. 1d; S5, depositing and patterning a reflective anode layer 8 on a structure illustrated in FIG. 1d, as illustrated in FIG. 1e; S6, forming a pixel definition layer 9 on a structure illustrated in FIG. 1e, exposing the reflective anode at a predetermined position, and forming a light emitting device (comprising a cathode 10 and an organic light emitting layer 11) in a sub-pixel region for light emitting, as illustrated in FIG. 1f.

For the above organic light emitting unit, its structure is complicated, its manufacturing processes are more, and its production cost is high.

Figure 2A:
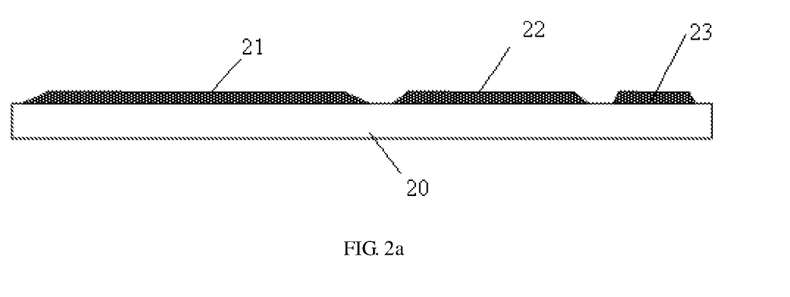
FIGS. 2a to 2h schematically illustrate steps of manufacturing an organic light emitting unit according to an embodiment of the present disclosure.
Figure 2B:
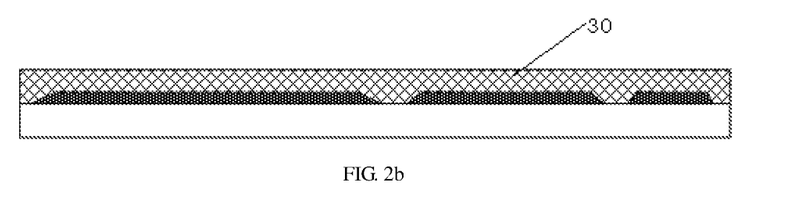
Figure 2C:
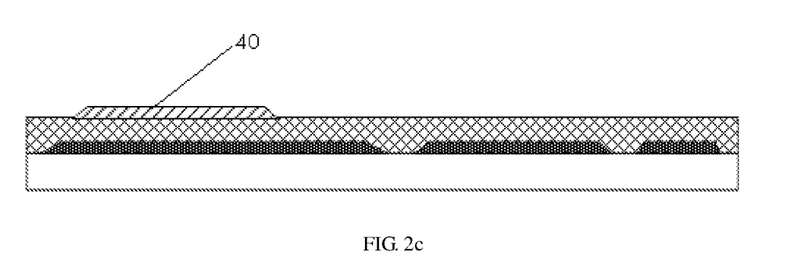
Figure 2D:
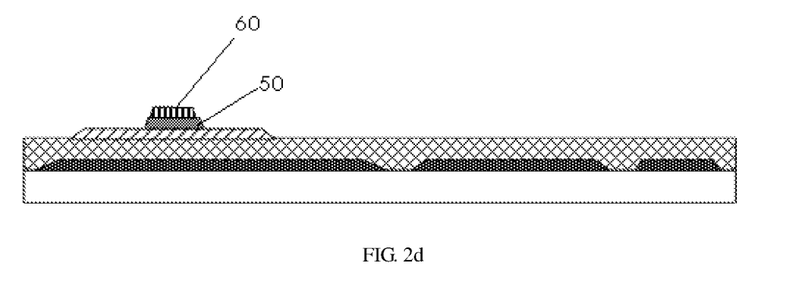
Figure 2E:
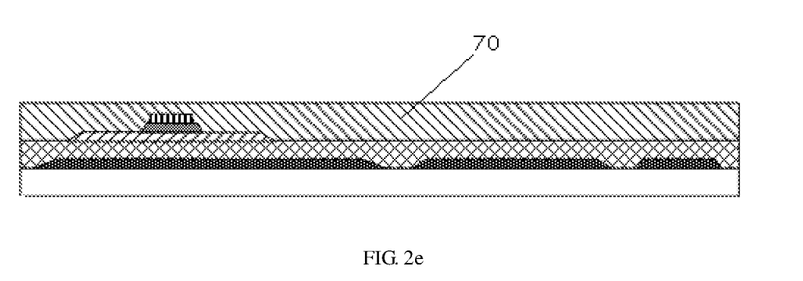
Figure 2F:
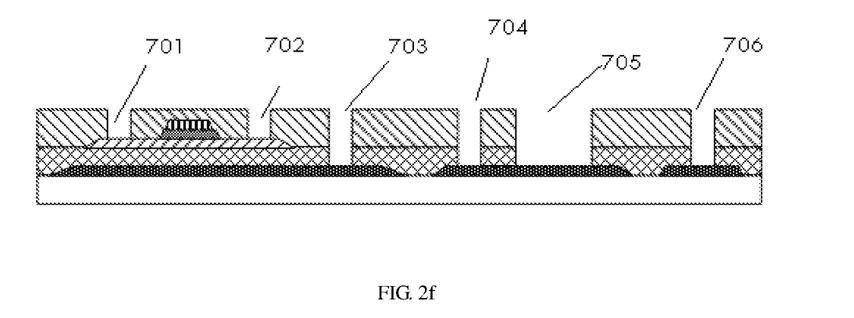
Figure 2G:
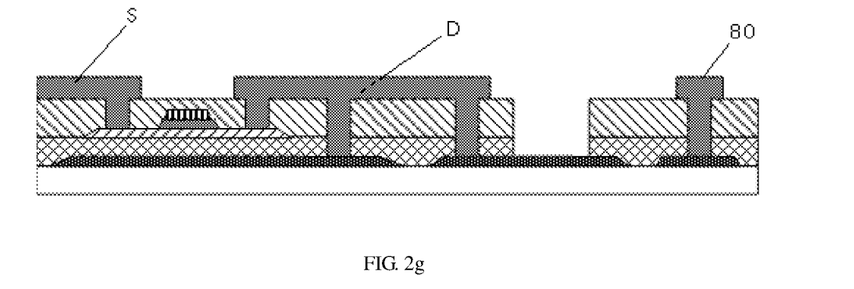
Figure 2H:
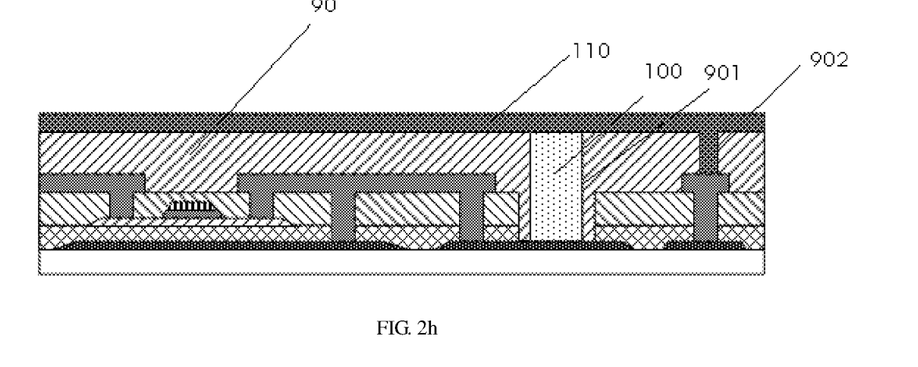

As illustrated in FIG. 2h, according to an embodiment of the present disclosure, there is provided an organic light emitting unit, which comprises: a substrate 20; a light shielding layer 21 and an anode 22 (i.e., a first electrode) disposed on the substrate 20, the light shielding layer 21 and the anode 22 are disposed on a same layer, and are made of a same material.

For example, the light shielding layer 21 and the anode 22 are made of a metal or an alloy. By using the light shielding layer 21, lights from a back side of the substrate (i.e., from bottom to up in FIG. 2a) can be blocked from irradiating the active layer.

Since the light shielding layer 21 and the anode 22 are disposed on the same layer of the substrate, not only the process steps can be simplified, the process time and the cost can be saved, but also the thickness of the display panel can be reduced, so it is advantageous for thinning the display substrate.

For example, the organic light emitting unit further comprises a thin film transistor (TFT) disposed on the light shielding layer 21, as illustrated in FIGS. 2a to 2h, a TFT is disposed on the substrate 20 on which the light shielding layer 21 and the anode 22 are disposed, and the TFT comprises an active layer 40, a first insulation layer 30, a gate 60, a source S, a drain D and a second insulation layer 70. The anode 22 is disposed below the drain D, and is electrically connected with the drain D through a first contact hole 704. The first contact hole 704 passes through the first insulation layer 30 and the second insulation layer 70. The source S is connected with the active layer 40 through the contact hole 701, and the drain D is connected with the active layer 40 through the contact hole 702. For example, the contact hole 704, the contact holes 701 and 702 may be formed in a same patterning process.

Figure 3:
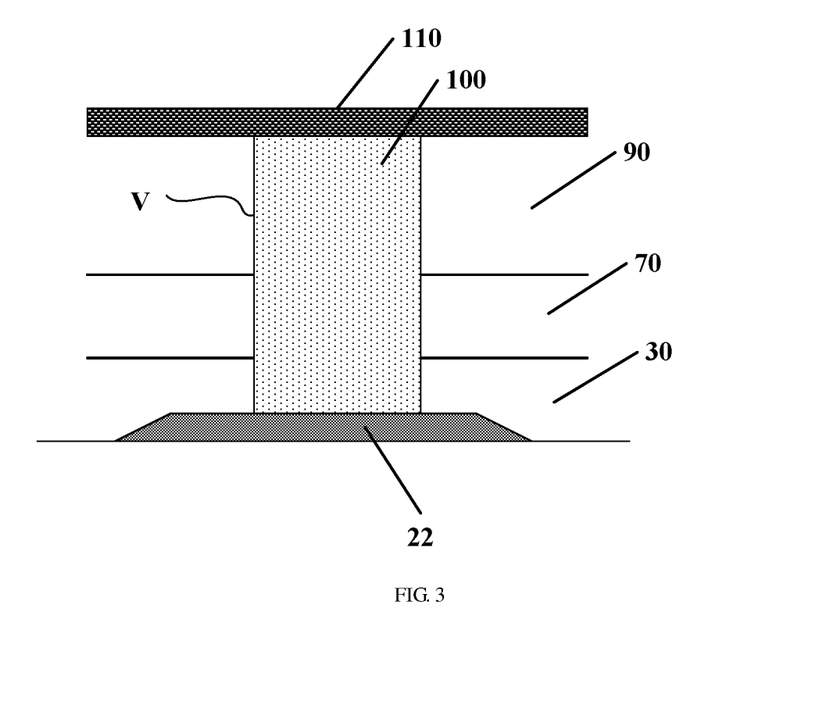
FIG. 3 schematically illustrates a contact hole according to an embodiment of the present disclosure.

For example, the organic light emitting unit further comprises a third insulation layer 90, an organic light emitting layer 100 and a cathode 110 (i.e., a second electrode) disposed on the anode 22, the organic light emitting layer 100 is disposed between the anode 22 and the cathode 110, the organic light emitting layer 100 is insulated from the TFT by the third insulation layer 90, and the organic light emitting layer is electrically connected with the anode 22 through a second contact hole 901 in the third insulation layer 90. The second contact hole 901 passes through the whole third insulation layer 90, that is, it is surrounded by the third insulation layer 90. It can be understood that, in other embodiments, the second contact hole 901 may be formed in other ways. For example, as illustrated in FIG. 3, the second contact hole 901 may be a through hole V passing through each of the first insulation layer 30, the second insulation layer 70, and the third insulation layer 90, as long as the electrical connection between the anode 22 and the cathode 110 can be achieved.

For example, as illustrated in FIG. 2a, the organic light emitting unit further comprises an auxiliary trace 23 disposed on the substrate 20, and the auxiliary trace 23, the light shielding layer 21 and the anode 22 are disposed on the same layer and made of the same material. For example, the light shielding layer 21, the anode 22 and the auxiliary trace 23 is formed by a single patterning process, therefore, the manufacturing processes can be further simplified and the electrical connection between the cathode 110 and the auxiliary trace 23 is achieved.

For example, as illustrated in FIG. 2g, the organic lighting emitting unit further comprises a connection portion 80 disposed on the same layer as the source S and the drain D, and the connection portion 80 is configured to electrically connect the auxiliary trace 23 with the cathode 110. As illustrated in FIG. 2h, a contact hole 902 is disposed above the connection portion 80, and the cathode 110 is electrically connected with the connection portion 80 through the contact hole 902, thus the electrical connection between the second electrode 110 and the auxiliary trace 23 is achieved. It can be understood that, the design of the connection portion 80 and the contact hole 902 is only for illustrative purposes, in other embodiments, it may be designed in other ways, for example, in order to omit the connection portion 80, the via hole may be disposed on the auxiliary trace 23 and pass through each of the first insulation layer 30, the second insulation layer 70 and the third insulation layer 90, while the cathode 110 may be disposed in the via hole, therefore, the electrical connection between the cathode 110 and the auxiliary trace 23 can be achieved.

For example, as illustrated in FIG. 2g, the connection portion 80 is made of the same material as the source S and the drain D, thus, they may be formed by a single patterning process, therefore, the processes are simplified. In other embodiments, the connection portion 80 may be made of the material different from the source and the drain.

According to an embodiment of the present disclosure, there is further provided an organic light emitting display panel, which comprises an organic light emitting unit described in any above embodiment. The organic light emitting display panel, for example, is an active matrix organic light emitting display panel, which comprises a plurality of organic light emitting units arranged in an array.

Since the light shielding layer and the first electrode of the organic light emitting unit are disposed on the same layer and made of the same material, the configuration of the display panel is simplified, and the thickness of the display panel is reduced.

According to an embodiment of the present disclosure, there is further provided a method for manufacturing an organic light emitting unit, which comprises: providing a substrate; and forming a light shielding layer and a first electrode on the substrate, the light shielding layer and the first electrode are disposed on a same layer and made of a same material. For example, the light shielding layer 21 and an anode 22 are made of metal or alloy. Lights from the back side of the substrate can be blocked from irradiating the active layer.

For example, as illustrated in FIG. 2a, the light shielding layer 21 and the anode 22 are formed by a single patterning process. The term "patterning process" in the present disclosure is a patterning process known to those skilled in the art such as ink-jet printing and photolithography technique etc. The photolithography technique is taken as an example to illustrate the present embodiment. For example, a layer of film to be patterned is first formed on the substrate, then a layer of photoresist is formed on the layer of film to be patterned, next, the photoresist is exposed by a mask and developed, and the layer of film to be patterned is etched, and finally a patterned film is formed.

Since the light shielding layer 21 and the anode 22 are disposed on the same layer and made of the same material, they may be formed by a single patterning process; however, in conventional technology, the light shielding layer 21 is formed by a patterning process, the anode 22 is formed by another pattering process, and the two are stacked; in comparison with the conventional technology, the method of at least one embodiment of the present disclosure not only simplifies the process steps, reduces the process time and the cost, improves the yield, but also makes the thickness of the display panel thinner, which is advantageous for thinning the display substrate.

For example, the method for manufacturing the organic light emitting unit further comprises: forming a thin film transistor on the light shielding layer 21, the thin film transistor comprises an active layer 40, a first insulation layer 30, a gate 60, a source S, a drain D and a second insulation layer 70; and forming a first contact hole 704 passing through both the first insulation layer 30 and the second insulation layer 70, the anode 22 is disposed below the drain D and is electrically connected with the drain D through the first contact hole 704.

For example, the method for manufacturing the organic light emitting unit further comprises: forming a third insulation layer 90, an organic light emitting layer 100 and a cathode 110 on the anode 22, the organic light emitting layer 100 is disposed between the anode 22 and the cathode 110, the organic light emitting layer 100 is insulated from the thin film transistor by the third insulation layer 90; and forming a second contact hole 902 in the third insulation layer 90, the organic light emitting layer 100 is electrically connected with the anode 22 through the second contact hole 901. In other embodiments, the contact hole 901 passes through each of the first insulation layer 30, the second insulation layer 70 and the third insulation layer 90.

For example, the method for manufacturing the organic light emitting unit further comprises: forming an auxiliary trace 23 on the substrate 20, at the same time of the formation of the light shielding layer 21 and the anode 22 on the substrate; the auxiliary trace 23, the light shielding layer 21 and the anode 22 are disposed on a same layer and made of a same material. As illustrated in FIG. 2a, the auxiliary trace 23, the light shielding layer 21 and the anode 22 are formed simultaneously by a same patterning process.

For example, in the above manufacturing method, the auxiliary trace 23 is disposed on the substrate 20, at the same time of the formation of the light shielding layer 21 and the anode 22 on the substrate, and all of the auxiliary trace 23, the light shielding layer 21 and the anode 22 are disposed on the same layer and made of the same material; In this case, the method for manufacturing the organic light emitting unit further comprises: electrically connecting the second electrode 110 and the auxiliary trace 23.

For example, in the above manufacturing method, the forming the thin film transistor on the light shielding layer 21 comprises: forming a connection portion 80 on the same layer as the source S and the drain D, the connection portion 80 is configured to electrically connect the second electrode 110 with the auxiliary trace 23.

An example of the method for manufacturing the organic light emitting unit is further described as below. The method for manufacturing the organic light emitting unit comprises:

S1, providing a substrate. For example, the substrate comprises but is not limited to a transparent substrate.

S2, forming a light shielding layer and an anode on a same layer of the substrate. The light shielding layer is configured to block lights from being irradiated to an active layer through the substrate; the anode serves as an electrode of an OLED light emitting device.

S3, forming a TFT on the substrate on which the light shielding layer and the anode are disposed, the TFT comprises an active layer, a gate insulation layer, a gate, a source, and a drain; the drain and the anode are electrically connected with each other. In the present embodiment, the TFT is a top-gate TFT, of course, the TFT may also be a bottom-gate TFT; the gate insulation layer is disposed between the gate and the active layer; the source and the drain are respectively connected with the active layer; the active layer includes, but is not limited to, a metal oxide such as IGZO.

S4, forming an organic light emitting layer and a cathode on the substrate on which the TFT is disposed, the organic light emitting layer is disposed between the anode and the cathode, and is connected with the anode and the cathode, respectively. The anode, the cathode and the organic light emitting layer between the two form an OLED light emitting device.

According to the method for manufacturing the organic light emitting unit provided in embodiments of the present disclosure, since the light shielding layer and the anode are disposed on the same layer of the substrate, they may be formed by a single patterning process; however, in conventional technology, the light shielding layer is formed first by a patterning process, the anode is formed by another patterning process, and the two are stacked; in comparison with the conventional technology, the method of at least one embodiment of the present disclosure not only simplifies the process steps, reduces the process time and the cost, improves the yield, but also makes the thickness of the display panel thinner, which is advantageous for thinning the display substrate.

In step S2, for example, the light shielding layer and the anode are formed by using a single patterning process. Conductive materials with high reflectivity and strong conductivity may be selected for the light shielding layer and the anode. The material may be of single-layer or multi-layer structure. For example, AlNd, or Ag, or Al may be used as the single-layer structure. For another example, a lamination of ITO—Ag—ITO, or a lamination of Mo—Al—ITO, or a lamination of Mo—AlNd—ITO may be used as the multi-layer structure.

For example, the method further comprises: forming an auxiliary trace at the same time of forming the light shielding layer and the anode on the same layer of the substrate; in this case, after forming the organic light emitting layer and the cathode on the structure with the source and the drain in step S4, the method further comprises: connecting the cathode and the auxiliary trace. The auxiliary trace serves to reduce the cathode resistance of the OLED device, thereby the problem that the resistance of the transparent cathode of the OLED device is hard to meet the requirement of large-sized display panel is solved, the conductivity of the cathode is improved, and IR drop is avoided.

For example, in order to facilitate the connection between the auxiliary trace and the cathode, in at least some of the present embodiment, the step S3 further comprises: forming a connection portion on the same layer as the source and the drain, the connection portion is connected with the auxiliary trace. In this case, after forming the organic light emitting layer and the cathode on the structure on which the source and the drain are disposed in step S4, the method further comprises: connecting the cathode and the connection portion.

For example, the step of forming the TFT on the substrate on which the light shielding layer and the anode are disposed in step S3, further comprises: electrically connecting the drain and the light shielding layer, thus channels are formed above and below the active layer, and then the electrical stability of the TFT is improved.

As another example, with reference to FIGS. 2a to 2h, the method for manufacturing the organic light emitting unit provided in embodiments of the present disclosure is described in detail below. The method for manufacturing the organic light emitting unit comprises:

S1, providing a substrate 20.

S2, forming a light shielding layer 21, an anode 22 and an auxiliary trace 23 on a same layer of the substrate 20, as illustrated in FIG. 2a. For example, a metal layer is first formed on the substrate 20, and then the patterns of the light shielding layer 21, the anode 22 and the auxiliary trace 23 are formed simultaneously by a same patterning process, as illustrated in FIG. 2a.

S3, forming a TFT on the substrate on which the light shielding layer and the anode are disposed. For example, the step S3 comprises:

S31, as illustrated in FIG. 2b, forming a first insulation layer 30 on the substrate 20 on which the light shielding layer 21 is disposed.

S32, as illustrated in FIG. 2c, forming an active layer 40 on the first insulation layer 30 at a position corresponding to the light shielding layer.

S33, as illustrated in FIG. 2d, forming a gate insulation layer 50 and a gate 60 on the active layer 40. For example, patterns of the two may be formed with a mask by wet etching firstly and dry etching secondly, which is called a self-aligned process.

S34, as illustrated in FIG. 2e, forming a second insulation layer 70 on the substrate 20 on which the gate 60 is disposed.

S35, as illustrated in FIG. 2f, forming a contact hole configured for electrical connection on the first insulation layer 30 and the second insulation layer 70 by a single patterning process. For example, the contact hole comprises: a contact hole 701 and a contact hole 702 both passing through the second insulation layer and are configured to electrically connect the source S and the drain D with the active layer respectively; a contact hole 703 passing through each of the first insulation layer 30 and the second insulation layer 70 and is configured to electrically connect the drain D with the light shielding layer 21; a contact hole 704 passing through each of the first insulation layer 30 and the second insulation layer 70, and is configured to electrically connect the drain D with the anode 22; a contact hole 705 passing through each of the first insulation layer 30 and the second insulation layer 70, and is configured to electrically connect an organic light emitting layer with the anode 22; and a contact hole 706 passing through each of the first insulation layer 30 and the second insulation layer 70 and is configured to electrically connect a connection portion 80 and an auxiliary trace 23.

S36, as illustrated in FIG. 2g, forming the source S, the drain D and the connection portion 80 on the same layer of the substrate on which the second insulation layer 70 is disposed; for example, depositing a metal layer firstly, and then forming the source S, the drain D and the connection portion 80 by a single patterning process. It is noted that, herein, an etchant used in the patterning process has a high selectivity ratio with a material of the anode 22, so as to prevent the anode 22 from being etched away while materials of the source and drain are etched away.

S4, forming the organic light emitting layer and a cathode on the substrate on which the TFT is disposed. For example, as illustrated in FIG. 2h, the step S4 comprises:

S41, forming a third insulation layer 90 on the substrate 20 on which the source S, the drain D and the connection portion 80 is disposed. For example, the third insulation layer 90 overlays an entire surface of the substrate and fills in the contact hole 705.

S42, forming the contact hole in the third insulation layer 90 by a single patterning process; for example, forming the contact hole 901, which passes through the third insulation layer 90 and is configured to electrically connect the organic light emitting layer 100 and the anode 22; forming the contact hole 902 which is configured to electrically connect the cathode 110 and the connection portion 80.

S43, forming the organic light emitting layer 100 and the cathode 110 on the substrate 20 on which the third insulation layer 90 is disposed. For example, the organic light emitting layer 100 fills in the contact hole 901, a lower end thereof is connected with the anode 22, and is coplanar with a lowest end of the drain D. The cathode 110 fills in the contact hole 902, and is electrically connected with the connection portion 80.

In above embodiment, in order to simplify the manufacturing process, the auxiliary trace 23 and the light shielding layer 21 are both connected with the source-drain metal layer; it is understood that, in practical applications, the auxiliary trace 23 and the light shielding layer 21 may be connected with other layers.

In above embodiment, the third insulation layer 90 may be a passivation layer In this case, the contact hole 705 may not necessary, instead, in step S42, the passivation layer, the first insulation layer 30 and the second insulation layer 70 are etched by a patterning process so as to form a contact hole passing through the three, which is configured to connect the organic light emitting layer with the anode 22; meanwhile, the etchant used the patterning process in step S36 may be not necessary to have a high selectivity ratio with the material of the anode 22.

In above embodiment, the third embodiment 90 may also be a pixel definition layer, since the material of the pixel definition layer is usually an organic adhesive, which may be exposed and developed in step S42, such that the contact hole 901 and the contact hole 902 are formed.

In the present disclosure, there are the following points needed to be explained:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. An organic light emitting unit, comprising:
a substrate;
a light shielding layer, located on the substrate,
a first electrode, located on a same layer as the light shielding layer and is made of a same material as the light shielding layer, the first electrode is an anode electrode,
wherein the light shielding layer and the anode electrode are spaced apart from each other, the light shielding layer and the anode electrode are in contact with the same layer, and the light shielding layer and the anode electrode are located on a same side of the same layer.

2. The organic light emitting unit according to claim 1, further comprising:
a thin film transistor located on the light shielding layer, wherein the thin film transistor comprises an active layer, a first insulation layer, a gate, a source, a drain and a second insulation layer; wherein the first electrode is below the drain and is electrically connected with the drain through a first contact hole, and the first contact hole passes through each of the first insulation layer and the second insulation layer.

3. The organic light emitting unit according to claim 2, further comprising:
a third insulation layer, an organic light emitting layer and a second electrode disposed on the first electrode, wherein the organic light emitting layer is between the first electrode and the second electrode, the organic light emitting layer is insulated from the thin film transistor by the third insulation layer, and the organic light emitting layer is electrically connected with the first electrode through a second contact hole in the third insulation layer.

4. The organic light emitting unit according to claim 3, wherein the second contact hole passes through each of the first insulation layer, the second insulation layer and the third insulation layer.

5. The organic light emitting unit according to claim 1, further comprising: an auxiliary trace located on the substrate, wherein the auxiliary trace, the light shielding layer and the first electrode are located on the same layer and made of the same material.

6. The organic light emitting unit according to claim 2, further comprising: the auxiliary trace located on the substrate, wherein the auxiliary trace, the light shielding layer and the first electrode are disposed on the same layer and made of the same material, and the second electrode is electrically connected with the auxiliary trace.

7. The organic light emitting unit according to claim 6, further comprising: a connection portion located on a same layer as the source and the drain, wherein the connection portion is configured to electrically connect the auxiliary trace with the second electrode.

8. The organic light emitting unit according to claim 7, wherein the connection portion is made of a same material as the source and the drain.

9. An organic light emitting display panel, comprising: an organic light emitting unit according to claim 1.

10. The organic light emitting unit according to claim 1, the light shielding layer has a single-layer structure, and a gap is provided between the light shielding layer and the anode electrode.

11. A method for manufacturing an organic light emitting unit, comprising:
providing a substrate; and
forming a light shielding layer and a first electrode on the substrate, wherein the light shielding layer and the first electrode are disposed on a same layer and made of a same material,
wherein the first electrode is an anode electrode, the light shielding layer and the anode electrode are spaced apart from each other, the light shielding layer and the anode electrode are in contact with the same layer, and the light shielding layer and the anode electrode are located on a same side of the same layer, and
wherein the light shielding layer and the first electrode are formed simultaneously by a same patterning process.

12. The method for manufacturing an organic light emitting unit according to claim 11, further comprising:
forming a thin film transistor on the light shielding layer, wherein the thin film transistor comprises an active layer, a first insulation layer, a gate, a source, a drain and a second insulation layer; and
forming a first contact hole passing through the first insulation layer and the second insulation layer, wherein the first electrode is below the drain and is electrically connected with the drain through the first contact hole.

13. The method for manufacturing an organic light emitting unit according to claim 12, further comprising:
forming a third insulation layer, an organic light emitting layer and a second electrode on the first electrode, wherein the organic light emitting layer is disposed between the first electrode and the second electrode, and the organic light emitting layer is insulated from the thin film transistor by the third insulation layer; and
forming a second contact hole in the third insulation layer, wherein the organic light emitting layer is electrically connected with the first electrode through the second contact hole.

14. The method for manufacturing an organic light emitting unit according to claim 13, wherein the second contact hole passes through each of the first insulation layer, the second insulation layer, and the third insulation layer.

15. The method for manufacturing an organic light emitting unit according to claim 11, further comprising: forming an auxiliary trace on the substrate at a same time of forming the light shielding layer and the first electrode on the substrate, wherein the auxiliary trace, the light shielding layer and the first electrode are disposed on the same layer and made of the same material.

16. The method for manufacturing an organic light emitting unit according to claim 15, wherein the auxiliary trace, the light shielding layer and the first electrode are formed simultaneously by a same patterning process.

17. The method for manufacturing an organic light emitting unit according to claim 13, further comprising: forming an auxiliary trace on the substrate at a same time of forming the light shielding layer and the first electrode on the substrate, wherein the auxiliary trace, the light shielding layer and the first electrode are disposed on the same layer and made of the same material;
the method further comprising: electrically connecting the second electrode with the auxiliary trace.

18. The method for manufacturing an organic light emitting unit according to claim 17, wherein the forming the thin film transistor on the light shielding layer comprises: forming a connection portion on the same layer as the source and the drain, and the connection portion is configured to electrically connect the second electrode with the auxiliary trace.

* * * * *